(12) United States Patent
Mori

(10) Patent No.: US 12,332,278 B2
(45) Date of Patent: Jun. 17, 2025

(54) PROBE CARD

(71) Applicant: Japan Electronic Materials Corporation, Hyogo (JP)

(72) Inventor: Chikaomi Mori, Hyogo (JP)

(73) Assignee: JAPAN ELECTRONIC MATERIALS CORPORATION, Hyogo (JP)

(*) Notice: Subject to any disclaimer, the term of this patent is extended or adjusted under 35 U.S.C. 154(b) by 268 days.

(21) Appl. No.: 18/024,055

(22) PCT Filed: Sep. 15, 2020

(86) PCT No.: PCT/JP2020/034931
§ 371 (c)(1),
(2) Date: Mar. 1, 2023

(87) PCT Pub. No.: WO2022/059070
PCT Pub. Date: Mar. 24, 2022

(65) Prior Publication Data
US 2023/0266365 A1  Aug. 24, 2023

(51) Int. Cl.
*G01R 1/073* (2006.01)
*G01R 31/28* (2006.01)

(52) U.S. Cl.
CPC ..... *G01R 1/07371* (2013.01); *G01R 1/07328* (2013.01); *G01R 31/2889* (2013.01)

(58) Field of Classification Search
CPC ............ G01R 1/07371; G01R 1/07328; G01R 31/2889
(Continued)

(56) References Cited

U.S. PATENT DOCUMENTS

2013/0265074 A1   10/2013  Sato
2018/0003767 A1*   1/2018  Crippa ............... G01R 1/07357
(Continued)

FOREIGN PATENT DOCUMENTS

JP       2013205098 A    10/2013
JP       2015072182 A    4/2015
(Continued)

OTHER PUBLICATIONS

International Search Report and Written Opinion issued in corresponding International Patent Application No. PCT/JP2020/034931 (with English translation of International Search Report) mailed Dec. 8, 2020 (6 pages).

*Primary Examiner* — Paresh Patel
(74) *Attorney, Agent, or Firm* — Kilyk & Bowersox, P.L.L.C.

(57) ABSTRACT

An object is to provide a probe card that enables probes to be arranged at a narrow pitch while causing the probes being inserted through guide holes of a guide plate to be locked to the guide plate so as not to fall out. Two or more probes 200 and a first guide plate 14 including two or more first guide holes 14h through which the probes 200 are inserted, respectively, are provided. The probe 200 is arranged so as to be inclined with respect to the first guide plate 14, and has a locking portion 21 formed by causing a side surface 210 on a first direction d1 side, which is a side surface above the first guide plate 14 and has an acute angle with respect to the first guide plate 14, to protrude, and an offset portion 22 formed by offsetting a side surface 220 on a second direction d2 side, which is a side surface above the first guide plate 14 and has an obtuse angle with respect to the first guide plate 14, to the locking portion side 21. A pair of the probes 220, adjacent to each other, is arranged such that the locking
(Continued)

portion 21 of one of the pair opposes the offset portion 22 of the other.

3 Claims, 17 Drawing Sheets

(58) Field of Classification Search
USPC .................................................. 324/754.07
See application file for complete search history.

(56) References Cited

U.S. PATENT DOCUMENTS

| | | | |
|---|---|---|---|
| 2020/0292576 A1* | 9/2020 | Perego | G01R 1/06733 |
| 2021/0373048 A1* | 12/2021 | Chen | G01R 1/0675 |
| 2022/0341969 A1* | 10/2022 | Lou | G01R 1/06733 |

FOREIGN PATENT DOCUMENTS

| | | | |
|---|---|---|---|
| JP | 2018044912 A | 3/2018 | |
| JP | 2019525204 A | 9/2019 | |
| WO | 2010105131 A1 | 9/2010 | |
| WO | 2020012799 A1 | 1/2020 | |

* cited by examiner

PROBE CARD

This application is a National Stage Application of PCT/JP2020/034931, filed Sep. 15, 2020.

TECHNICAL FIELD

The present invention relates to a probe card, and more particularly to an improvement of a probe card in which two or more probes are supported by a guide plate.

BACKGROUND ART

A probe card is an inspection apparatus used to inspect electrical characteristics of a semiconductor device formed on a semiconductor wafer, and a large number of probes to be brought into contact with electrode pads on the semiconductor device are provided on a wiring board. Characteristics of the semiconductor device are inspected by connecting a tester apparatus performing input and output of a test signal to the probe card, bringing the semiconductor wafer close to the probe card to bring a tip of the probe into contact with the electrode pad on the semiconductor device, and causing conduction between the tester apparatus and the semiconductor device via the probe and the wiring board.

FIG. 17 is a diagram illustrating an example of a conventional probe card (for example, Patent Literature 1). In this probe card, probes 300 each having a locking portion 31 are supported by a guide plate 14. In the probe card, the guide plate 14 and a guide plate 15 are provided below wiring boards 10 and 11. The probe 300 is inserted through guide holes 14$h$ and 15$h$ of both the guide plates 14 and 15, and has an upper end, which is in contact with a probe electrode 11$t$ formed on a lower surface of the wiring board 11, and a lower end which is in contact with an electrode pad formed on an upper surface of a semiconductor wafer.

The probe 300 has a pair of the locking portions 31 on side surfaces protruding above the upper guide plate 14. The pair of locking portions 31 is formed by causing opposing side surfaces of the probe to protrude, and the probe 300 is supported so as not to fall out of the first guide plate 14.

CITATION LIST

Patent Literature

Patent Literature 1: JP 2018-44912 A

SUMMARY OF INVENTION

Technical Problem

With the recent progress of microfabrication technology, a pitch between electrode pads in semiconductor devices decreases, and accordingly, there is a demand for a decrease in a pitch between probes. In order to decrease the pitch in arrangement of the probes, it is necessary to shorten a probe width or a probe interval. However, there is a limit to a reduction of a cross-sectional area of the probe in consideration of electrical characteristics and mechanical strength required for the probe. Therefore, in order to further decrease the pitch, it is necessary to shorten the probe interval, and accordingly, it is also necessary to shorten a protrusion amount of the locking portion 31.

With the progress of such a decrease in the pitch, the protrusion amount of the locking portion 31 becomes close to a gap between the probe 300 and the guide hole 14$h$, and there is a possibility that the locking portion 31 falls out of the guide hole 14$h$ if the protrusion amount is further shortened.

The present invention has been made in view of the above circumstances, and an object thereof is to provide a probe card that enables probes to be arranged at a narrow pitch while causing the probes being inserted through guide holes of a guide plate to be locked to the guide plate so as not to fall out.

Solution to Problem

A probe card according to a first aspect of the present invention includes: two or more probes; and a first guide plate having two or more first guide holes through which the probes are inserted, respectively, and is configured such that the probe is arranged to be inclined with respect to the first guide plate and has a locking portion formed by causing a side surface on a first direction side, which is a side surface of the probe above the first guide plate and has an acute angle with respect to the first guide plate, to protrude, and a side surface on a second direction side, which is a side surface of the probe above the first guide plate and has an obtuse angle with respect to the first guide plate, has a shorter distance from a central axis of the probe than a protruding surface of the locking portion.

Since the probe inserted through the first guide hole is inclined with respect to the first guide plate, and the locking portion is formed by causing the side surface on the first direction side, which is the side surface above the first guide plate and has the acute angle with respect to the first guide plate, to protrude, the locking portion opposes an upper surface of the first guide plate in the periphery of the first guide hole, and the probe is locked to the first guide plate. Therefore, a protrusion amount of the locking portion can be reduced regardless of a size of a gap between a probe width and the first guide hole, and the probes can be arranged at a narrow pitch. Furthermore, since the side surface on a side opposite to the first direction side, that is, the side surface on the second direction side which is the side surface above the first guide plate and has the obtuse angle with respect to the first guide plate, is at a distance closer to the central axis than the protruding surface of the locking portion, the probes can be arranged at a narrower pitch.

In addition to the above configuration, a probe card according to a second aspect of the present invention is configured such that the probe further includes an offset portion in which the side surface on the second direction side is offset toward the locking portion, and a pair of the probes adjacent to each other is arranged such that the locking portion of one of the pair opposes the offset portion of another.

Since such a configuration is adopted, two or more probes are arranged adjacent to each other such that the locking portion of one opposes the offset portion of the other, and a protruding direction of the locking portion and an offset direction of the offset portion are made to coincide, whereby the probes can be arranged at a narrower pitch. In addition, since the offset portion is formed on the side surface on the second direction side, the offset amount can be increased regardless of the size of the gap between the probe width and the first guide hole, and the probes can be arranged at a narrower pitch.

In addition to the above configuration, a probe card according to a third aspect of the present invention is configured such that a lower surface of the offset portion is formed below a lower surface of the locking portion on the central axis of the probe.

Since such a configuration is adopted, it is possible to suppress the lower end of the locking portion from coming into contact with the side surface below the offset portion, and to arrange the probes at a narrow pitch.

In addition to the above configuration, a probe card according to a fourth aspect of the present invention is configured such that an outermost edge of the lower surface of the offset portion is arranged below the upper surface of the first guide plate.

Since such a configuration is adopted, it is possible to prevent the lower end of the locking portion from coming into contact with the side surface below the offset portion, and to arrange the probes at a narrow pitch.

In addition to the above configuration, a probe card according to a fifth aspect of the present invention is configured such that the lower surface of the offset portion is inclined with respect to the central axis of the probe such that the offset amount decreases toward the lower side.

Since such a configuration is adopted, it is possible to suppress the locking portion from coming into contact with the side surface below the offset portion. In addition, it is possible to suppress an influence on electrical characteristics and mechanical strength of the probe by providing the offset portion.

In addition to the above configuration, a probe card according to a sixth aspect of the present invention further includes a wiring board which is arranged above the first guide plate and has two or more probe electrodes with which upper ends of the probes abut, respectively, and is configured such that the offset portion is a recess formed on a side surface opposing the locking portion.

Since such a configuration is adopted, a width of an upper end of the probe can be widened, a range of an inclination angle of the probe in which the upper end of the probe can be brought into contact with the probe electrode can be expanded, and the probe and the probe electrode can be more reliably conducted.

In addition to the above configuration, a probe card according to a seventh aspect of the present invention is configured such that an outermost edge of an upper surface of the offset portion is formed above an outermost edge of an upper surface of the locking portion on the central axis of the probe.

Since such a configuration is adopted, it is possible to suppress the upper end of the locking portion from coming into contact with the side surface above the offset portion, and to arrange the probes at a narrow pitch.

In addition to the above configuration, a probe card according to an eighth aspect of the present invention is configured such that the upper surface of the offset portion is inclined with respect to the central axis of the probe such that the offset amount decreases toward the upper side.

Since such a configuration is adopted, it is possible to suppress the locking portion from coming into contact with the side surface above the offset portion. In addition, it is possible to suppress an influence on electrical characteristics and mechanical strength of the probe by providing the offset portion.

In addition to the above configuration, a probe card according to a ninth aspect of the present invention further includes a second guide plate which is arranged below the first guide plate and has two or more second guide holes through which the probes are inserted, respectively, and is configured such that the first guide hole and the second guide hole are arranged at positions relatively offset in a direction in which the probe is inclined.

When such a configuration is adopted, the probe inserted through the first guide hole can be inclined with respect to the first guide plate.

Advantageous Effects of Invention

According to the present invention, it is possible to provide the probe card that enables the probes to be arranged at the narrow pitch while causing the probes being inserted through the guide holes of the guide plate to be locked to the guide plate so as not to fall out.

DESCRIPTION OF EMBODIMENTS

First Embodiment

<Probe Card 100>

Figure 1:
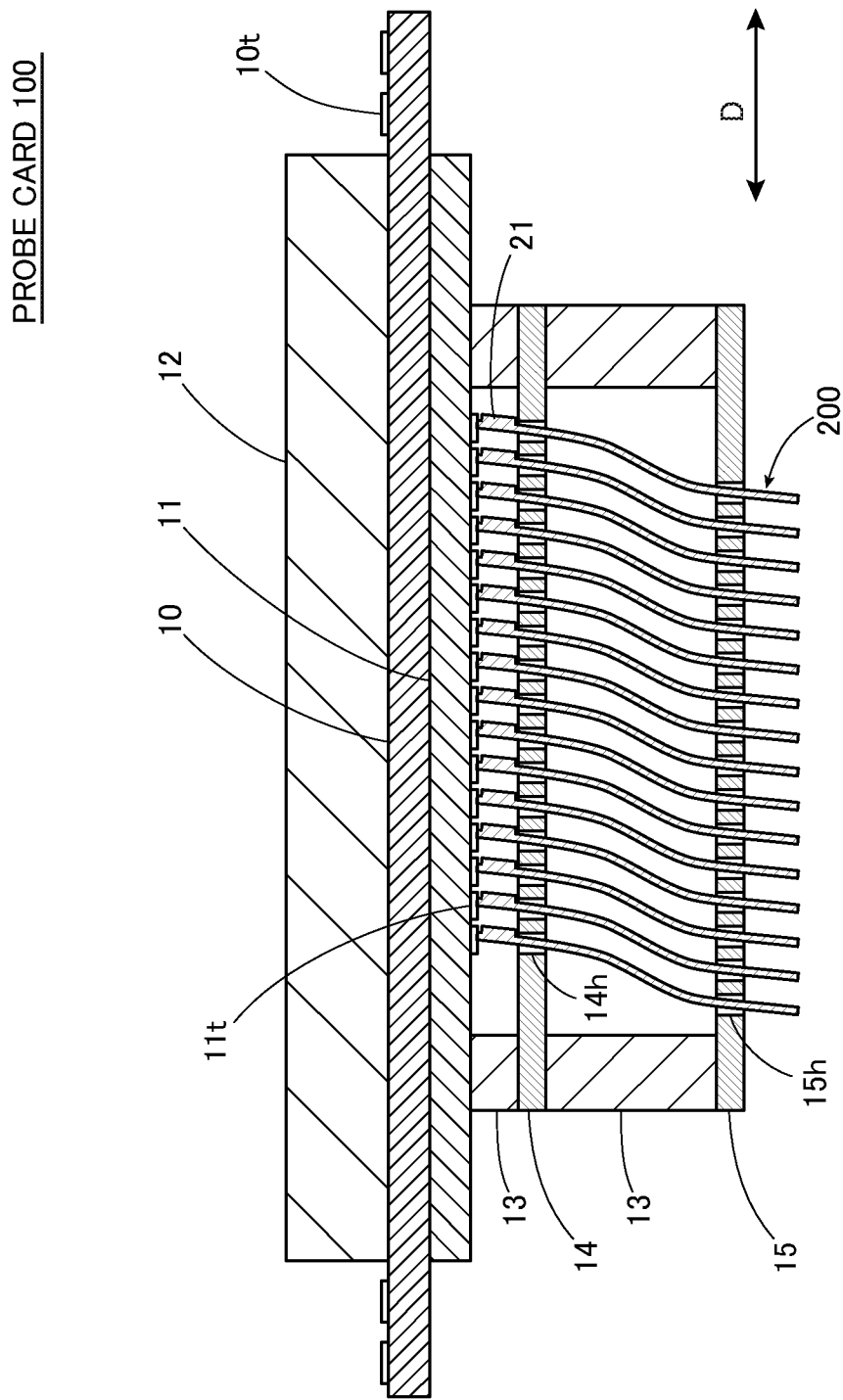
FIG. 1 is a cross-sectional view illustrating a configuration example of a probe card 100 according to a first embodiment of the present invention.

FIG. 1 is a cross-sectional view illustrating a configuration example of a probe card 100 according to a first embodiment of the present invention, and illustrates a cross section in a case where the probe card 100 arranged horizontally is cut along a vertical plane. The probe card 100 is an inspection apparatus that makes an electrical connection with respect to an inspection object (not illustrated) such as a semiconductor wafer, and a large number of probes 200, which are to be brought into contact with a large number of electrode pads on the inspection object, are disposed so as to correspond to the electrode pads. The illustrated probe card 100 includes a main board 10, a space transformer (ST) board 11, a reinforcing plate 12, a spacer 13, a first guide plate 14, a second guide plate 15, and two or more probes 200.

The main board 10 is a wiring board detachably attached to a prober (not illustrated), and for example, a disk-shaped printed circuit board can be used. The main board 10 is disposed substantially horizontally and has an upper surface to which the reinforcing plate 12 is attached. The reinforcing plate 12 is a reinforcing member for suppressing distortion of the main board 10, and for example, a metal block can be used. In addition, two or more external electrodes 10$t$ to which signal terminals of a tester (not illustrated) are connected are provided on the outer side of the reinforcing plate 12 on the main board 10, that is, at an outer peripheral edge portion of the upper surface of the main board 10.

The ST board 11 is a wiring board that converts an electrode pitch, and is attached to a lower surface of the main board 10. Two or more probe electrodes 11$t$ are formed on a lower surface of the ST board 11. The probe electrodes 11$t$ are electrode terminals with which the probes 200 are brought into contact, are disposed at a pitch to correspond to the probes 200, and are electrically connected to the external electrodes 10$t$ disposed at a wider pitch via wiring patterns and through-holes of the main board 10 and the ST board 11.

Each of the guide plates 14 and 15 is a support substrate that supports the probe 200, and for example, a flat silicon substrate can be used. The guide plates 14 and 15 are fixed to the main board 10 or the ST board 11 with the spacer 13 interposed therebetween, and are arranged substantially horizontally with a distance from the ST board 11.

The first guide plate 14 has two or more first guide holes 14$h$. The first guide hole 14$h$ is a through-hole penetrating the first guide plate 14 in the vertical direction, and the probe 200 is inserted therethrough. The first guide plate 14 is arranged to be separated downward from the ST board 11, supports the probe 200 so as not to fall out, and positions the probe 200 in the horizontal direction with respect to the ST board 11.

The second guide plate 15 has two or more second guide holes 15$h$. The second guide hole 15$h$ is a through-hole penetrating the second guide plate 15 in the vertical direction, and the probe 200 is inserted therethrough. The second guide plate 15 is arranged to be separated downward from the first guide plate 14, supports the probe 200 so as to be movable in the vertical direction, and positions the probe 200 in the horizontal direction with respect to the inspection object.

The guide holes 14$h$ and 15$h$ through which the same probe 200 is inserted are arranged so as to be offset by a certain distance in the horizontal direction. Since positions of the corresponding guide holes 14$h$ and 15$h$ are relatively offset, the probe 200 is curvedly deformed between the guide plates 14 and 15, and vicinities of both ends of the probe 200 are inclined with respect to the guide plates 14 and 15. An inclination direction D is a direction on a horizontal plane indicating the inclination of the probe 200.

The probe 200 is a vertical probe having an elongated shape and is made of a conductive material. The probe 200 has an upper end in contact with the probe electrode 11$t$ of the ST board 11, and a lower end is in contact with the electrode pad of the inspection object.

When overdrive processing of bringing the inspection object into contact with the probe 200 and then further bringing the both closer to each other is performed, the probe 200 is elastically deformed, and the lower end moves vertically. Therefore, the probe 200 at the time of non-inspection is curvedly deformed by the offset arrangement of the guide holes 14$h$ and 15$h$, and thus, it is possible to buckle and deform a curved portion of the probe 200 at the time of overdrive and secure a stroke length of the vertical movement while applying appropriate pressure to the inspection object. In addition, the probes 200 are curvedly deformed to have substantially the same shape at the time of non-inspection, and thus, it is possible to prevent the buckled and deformed probes from coming into contact between the guide plates 14 and 15.

<Guide Plates 14 and 15>

Figure 2:
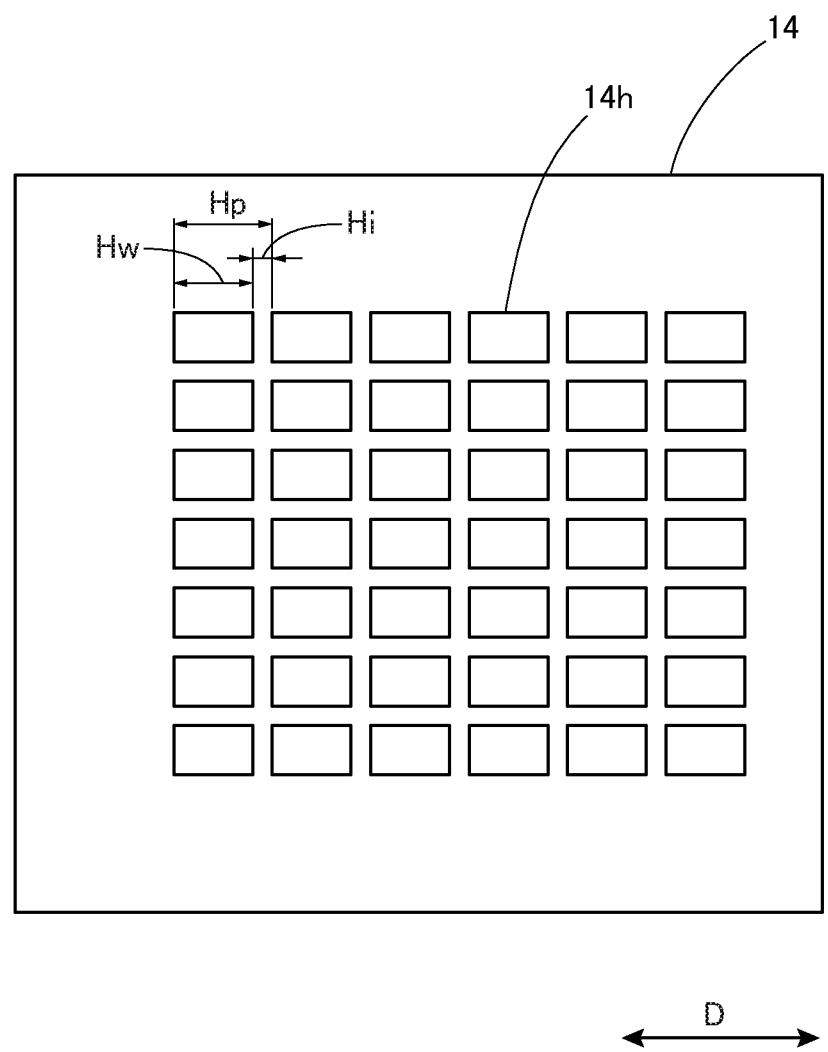
FIG. 2 is a plan view illustrating a configuration example of the first guide plate 14 in FIG. 1.

FIG. 2 is a plan view illustrating a configuration example of the first guide plate 14 in FIG. 1, and illustrates an upper surface of the first guide plate 14.

The illustrated first guide plate 14 is a substantially rectangular flat plate, and is two-dimensionally arranged such that a large number of the first guide holes 14$h$ are aligned in the inclination direction D and a direction orthogonal thereto. The first guide hole 14$h$ is a through-hole orthogonal to a main surface, and has a rectangular cross section having a pair of sides orthogonal to the inclination direction D.

When attention is paid to the inclination direction D, the first guide holes 14$h$ are through-holes each having a width Hw and are arranged at an interval Hi. That is, the first guide holes 14$h$ are aligned at a pitch Hp=Hw+Hi. A cross-sectional shape of the probe 200 is determined according to electrical characteristics, mechanical strength, and the like required for the probe 200. Therefore, it is necessary to shorten the interval Hi in order to arrange the probes 200 at a narrower pitch. Recently, the interval Hi between the first guide holes 14$h$ is required to be ½ or less of the width Hw, for example, ⅓ or less thereof. As a result, a short circuit between the adjacent probes 200 easily occurs.

The second guide plate 15 has exactly the same configuration as the first guide plate 14 except that the position of the second guide hole 15$h$ is offset with respect to the position of the first guide hole 14$h$.

Figure 3:
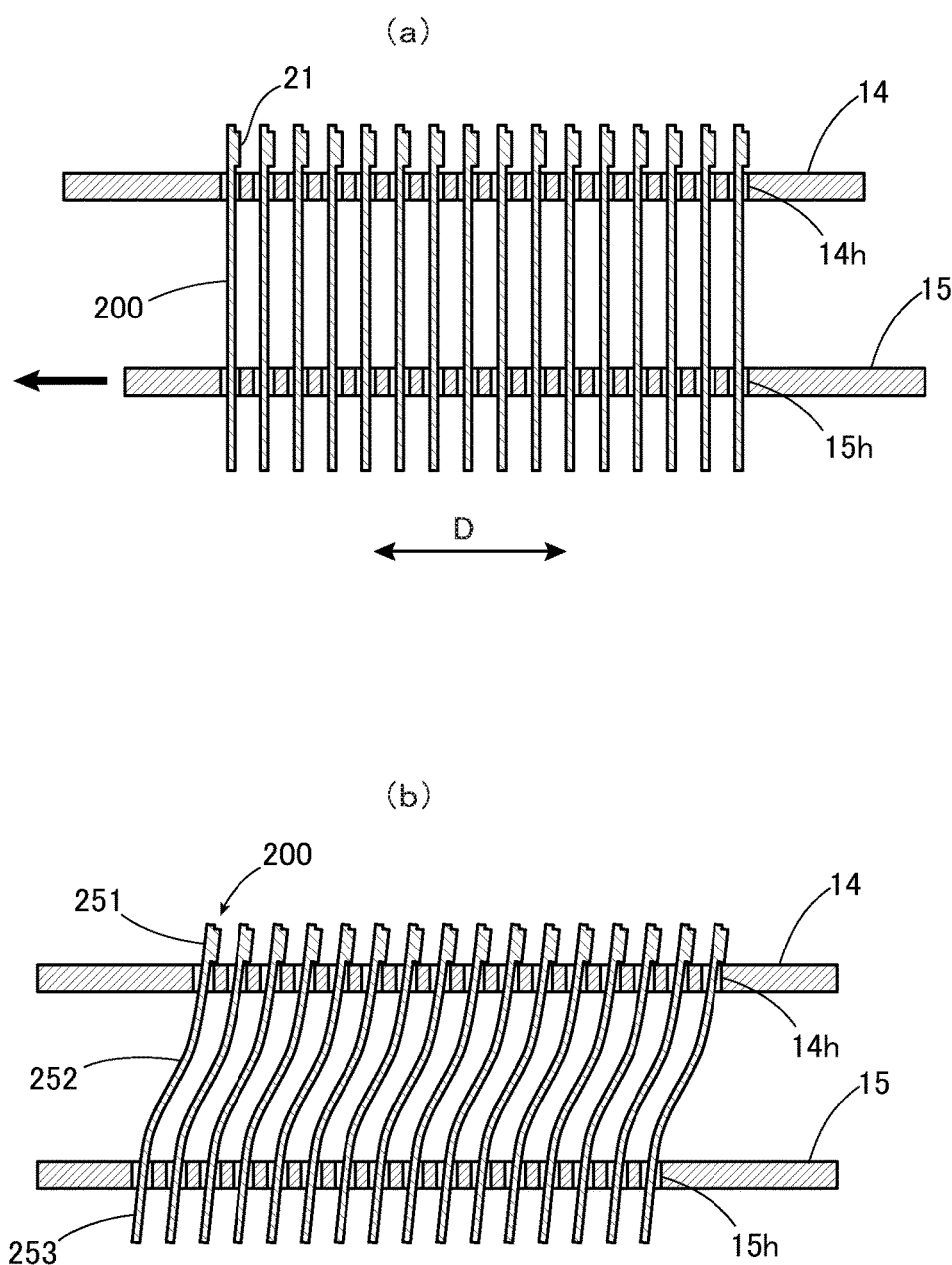
FIG. 3 is a schematic view illustrating a state at the time of assembling the probes 200 and the guide plates 14 and 15.

FIG. 3 is a schematic view illustrating a state at the time of assembling the probes 200 and the guide plates 14 and 15. A state in which the probes 200 are inserted through the guide holes 14$h$ and 15$h$ is illustrated in (a) of the drawing, and a state in which the guide holes 14$h$ and 15$h$ are offset and the probes 200 are curvedly deformed is illustrated in (b) of the drawing.

In the drawing, (a) illustrates a state in which the guide plates 14 and 15 are arranged such that positions of the corresponding guide holes 14$h$ and 15$h$ coincide, and the probes 200 each having a linear shape are inserted through the guide holes 14$h$ and 15$h$. Thereafter, when the guide plates 14 and 15 are relatively moved in parallel in the inclination direction D, the positions of the corresponding guide holes 14$h$ and 15$h$ can be offset. In the drawing, (b) illustrates a state after the guide holes 14$h$ and 15$h$ are offset. Thereafter, the ST board 11 is attached such that the upper ends of the probes 200 come into contact with the probe electrodes 11$t$.

<Probe 200>

Figure 4:
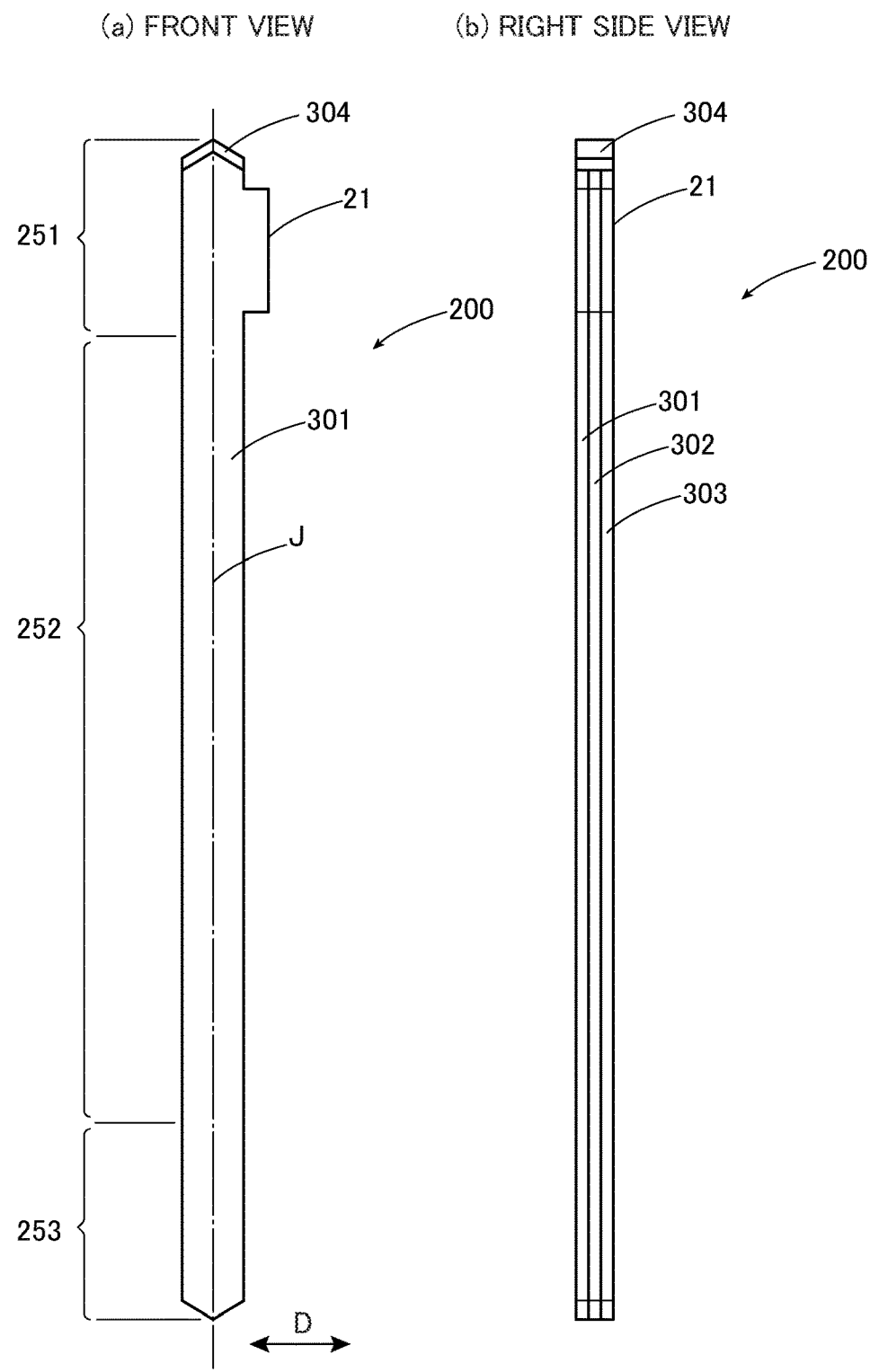
FIG. 4 is an external view illustrating a configuration example of the probe 200.

FIG. 4 is an external view illustrating a configuration example of the probe 200. In the drawing, (a) is a front view of the probe 200, and (b) is a right side view of the probe 200.

The probe 200 is formed as a columnar body having substantially the same rectangular cross section, and the upper end and the lower end of the probe 200 are sharpened such that a central axis J of the probe 200 protrudes. In addition, the probe 200 is provided with, in the vicinity of the upper end, a locking portion 21 formed by causing a part of a side surface to protrude.

The probe 200 is divided into a probe upper portion 251, a probe body 252, and a probe lower portion 253. The probe body 252 is an elastically deformable portion arranged between the guide plates 14 and 15, an upper side and a lower side of the probe body 252 are the probe upper portion 251 and the probe lower portion 253, respectively, and the locking portion 21 is provided in the probe upper portion 251.

The probe 200 has, for example, a three-layer structure in which one intermediate layer 302 is sandwiched between two outer layers 301 and 303, and is manufactured using the micro electro mechanical systems (MEMS) technology. The intermediate layer 302 is a conductive layer made of a metal material having good conductivity, and the outer layers 301 and 303 are stress layers made of a metal material having good mechanical strength. In addition, a contact layer 304 made of a metal material having good conductivity is formed on an upper end surface of the probe 200 so as to be in contact with each of end surfaces of the three main layers 301 to 303. The three main layers 301 to 303 are laminated as layers parallel to the central axis J and the inclination direction D, and the locking portion 21 is formed as a substantially rectangular protrusion in a planar shape of each of the layers 301 to 303.

Figure 5:
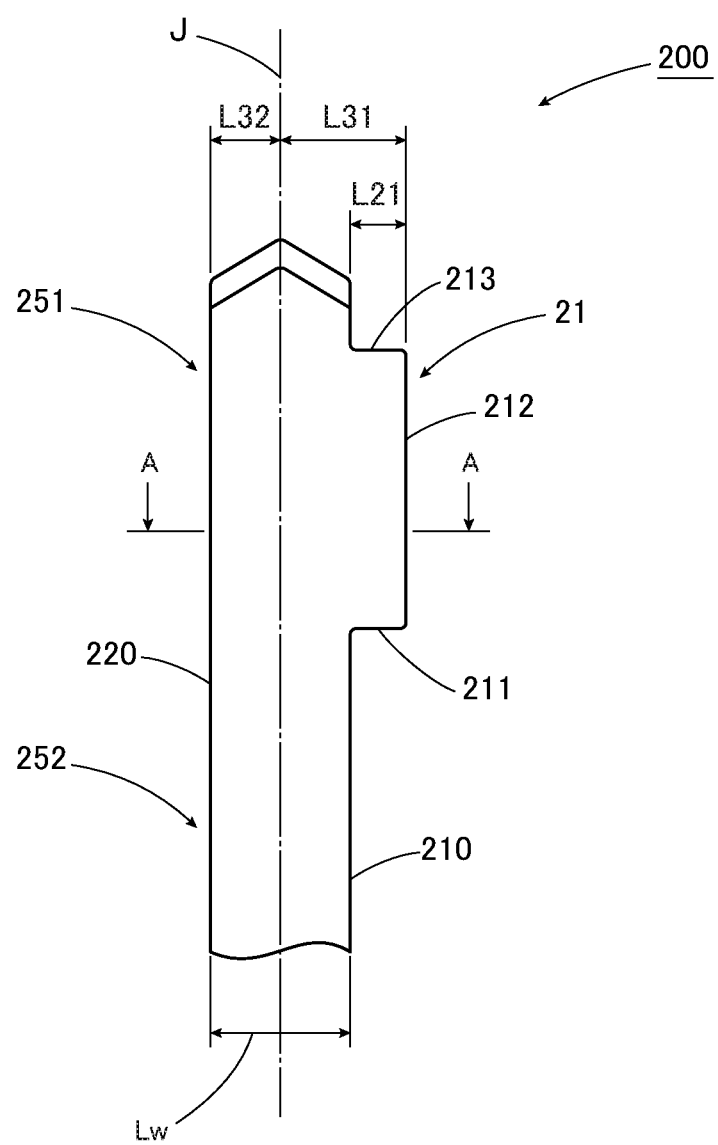
FIG. 5 is a partially enlarged view illustrating a part of the probe 200 in an enlarged manner.
Figure 6:
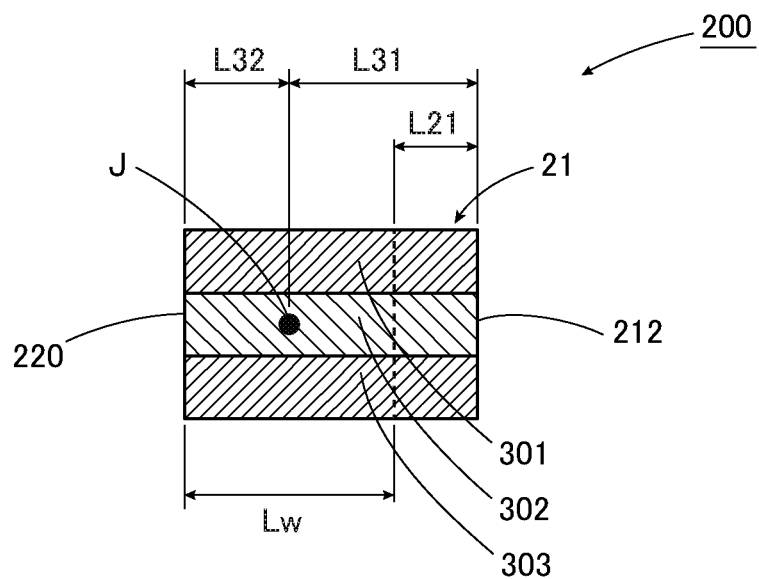
FIG. 6 is a cross-sectional view illustrating a cross section taken along line A-A in FIG. 5.

FIGS. 5 and 6 are views illustrating a detailed configuration of the probe 200 of FIG. 4. FIG. 5 is a partially enlarged view illustrating a part of the probe 200 in an enlarged manner, and FIG. 6 is a cross-sectional view illustrating a cross section taken along line A-A in FIG. 5.

The locking portion 21 is formed by causing a side surface 210 on one side in the inclination direction D to protrude in a direction perpendicular to the central axis J, and has a lower surface 211 and an upper surface 213 orthogonal to the central axis J, and a protruding surface 212 parallel to the central axis J. On the other hand, the locking portion is not formed on a side surface 220 on the other side in the inclination direction D.

In the drawing, Lw is a probe width, and L21 is a protrusion amount of the locking portion 21. A distance from the central axis J of the probe 200 is L31=Lw/2+L21 at the protruding surface 212 and L32=Lw/2 at the side surface 220 opposing the locking portion 21, and the distance of the side surface 220 from the central axis J is shorter than that of the protruding surface 212 by the protrusion amount L21.

Figure 7:
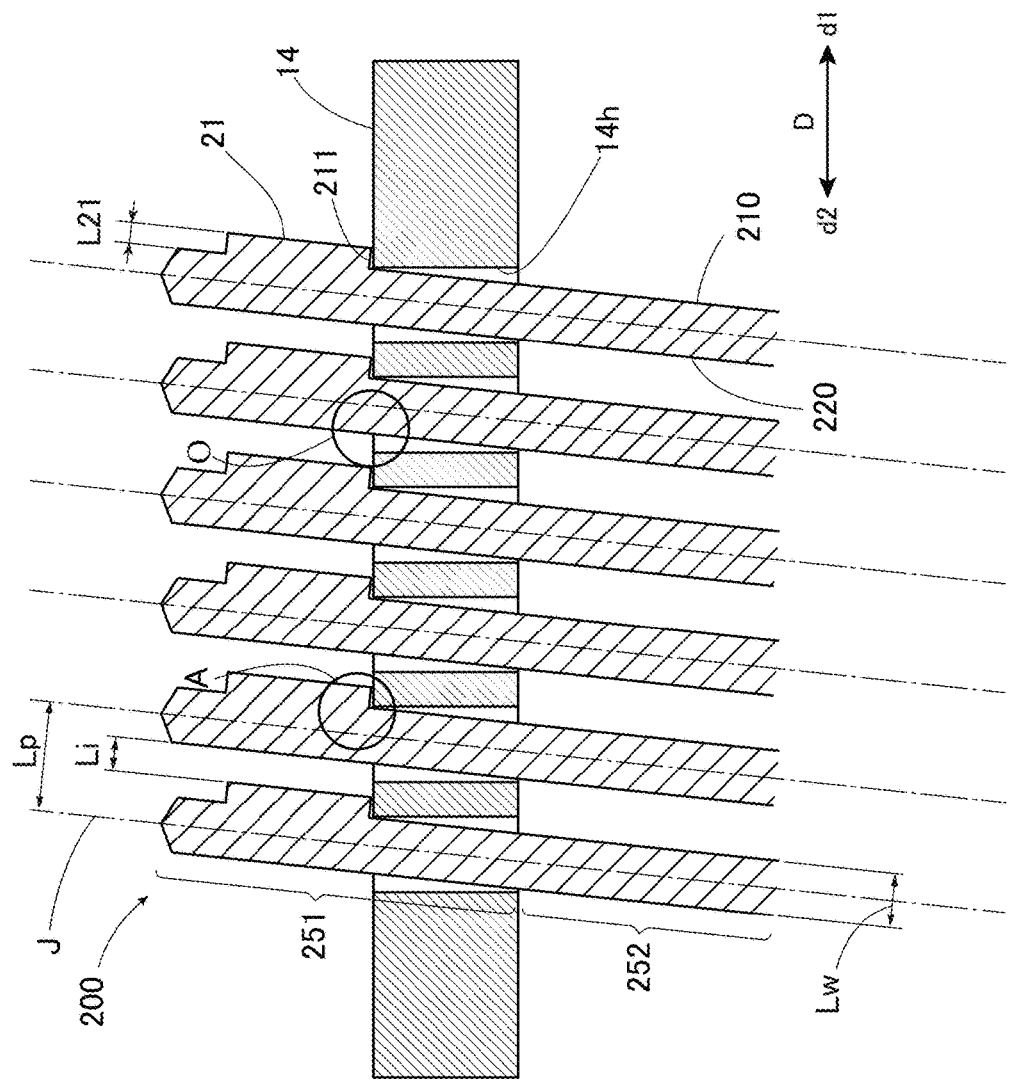
FIG. 7 is an enlarged cross-sectional view illustrating a part of the first guide plate 14 and the probes 200 in FIG. 1 in an enlarged manner.

FIG. 7 is an enlarged cross-sectional view illustrating a part of the first guide plate 14 and the probes 200 in FIG. 1 in an enlarged manner. The upper end of the probe 200 abuts on the probe electrode 11t of the ST board 11, and the lower surface 211 of the locking portion 21 abuts on the upper surface of the first guide substrate 14. Therefore, the probe 200 can be electrically connected to the probe electrode 11t, and the probe 200 can be supported so as not to fall out of the first guide hole 14h.

The probe upper portion 251 is arranged to be inclined in the inclination direction D with respect to the first guide plate 14. In the inclination direction D, a direction in which an angle formed by the first guide plate 14 and the central axis J of the probe 200 above the first guide plate 14 is an acute angle A defined as a first direction d1, and a direction opposite to the first direction d1, that is, a direction in which an angle formed by the first guide plate 14 and the central axis J of the probe 200 above the first guide plate 14 is an obtuse angle O defined as a second direction d2.

The locking portion 21 is formed on the side surface 210 of the probe upper portion 251 on the first direction d1 side. That is, the locking portion 21 is formed by causing the side surface 210, which is a side surface above the first guide plate 14 and has the acute angle A with respect to the first guide plate 14 due to the inclination, to protrude. Therefore, regardless of shapes and sizes of the locking portion 21 and the first guide hole 14h, the lower surface 211 of the locking portion 21 opposes the upper surface of the guide plate 14 in the periphery of the first guide hole 14h, the locking portion 21 is locked to the first guide plate 14, so that the probe 200 can be supported so as not to fall out of the first guide hole 14h.

For example, the probe 200 can be supported even in a case where the probe upper portion 251 is designed in advance as a shape that can pass through the first guide hole 14h or in a case where the probe upper portion 251 become possible to pass through the first guide hole 14h afterwards due to wear or damage.

In addition, the protrusion amount L21 of the locking portion 21 can be reduced as compared with a case where the locking portion 21 is formed on the side surface 220 on the second direction d2 side, that is, the side surface 220 which is a side surface above the first guide plate 14 and has an obtuse angle with respect to the first guide plate 14 due to the inclination, and thus, a probe pitch Lp can be decreased while securing a predetermined probe interval Li.

The probe interval Li is a distance from the protruding surface 212 of the locking portion 21 of one of two adjacent probes 200 to the side surface 220 on the second direction d2 side of the other, and the probe pitch is Lp=Lw+L21+Li. For example, when the probe width Lw is 20 µm, the protrusion amount L21 of the locking portion 21 is 7 µm, and the probe interval Li is 13 µm, the probe pitch Lp is 40 µm. In order to achieve the arrangement with a narrow pitch, the protrusion amount L21 of the locking portion 21 is desirably the probe width Lw or less, and is more desirably ½ of the probe width Lw or less. In addition, the probe interval Li is desirably the probe width Lw or less.

Figure 8:
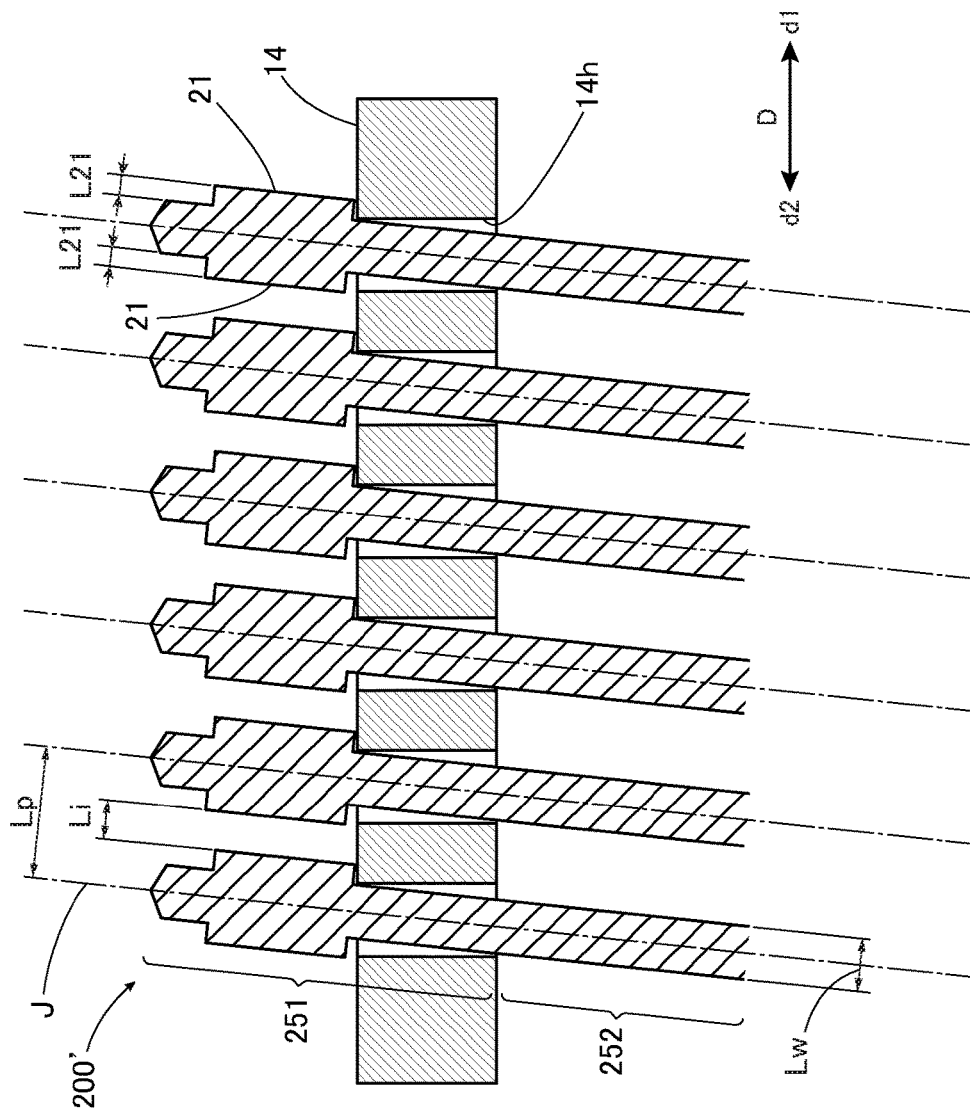
FIG. 8 is a view illustrating a main part of a comparative example to be compared with the first embodiment of the present invention.

FIG. 8 is a view illustrating a main part of a comparative example to be compared with the first embodiment of the present invention. A probe 200' as the comparative example is arranged to be inclined with respect to a first guide plate 14, and has a pair of locking portions 21 formed by causing two side surfaces 210 and 220 respectively on a first direction d1 side and a second direction d2 opposite to the first direction d1 to protrude. The probe 200' has a disadvantage that a probe pitch Lp set when the same probe interval Li is to be secured becomes longer by a protrusion amount L21 as compared with the probe 200 in FIG. 7.

In the probe card according to the present embodiment, the probe 200 is arranged to be inclined with respect to the first guide plate 14, and has the locking portion 21 formed by causing the side surface 210 on the first direction d1 side on which the angle formed by the probe 200 and the first guide plate 14 above the first guide plate 14 is the acute angle A to protrude. Therefore, the locking portion 21 can be locked to the upper surface of the first guide plate 14, and the probe 200 can be supported so as not to fall out. In addition, it is possible to shorten the protrusion amount L21 of the locking portion 21 and to shorten the probe pitch Lp regardless of a size of a gap between the probe 200 and the first guide hole 14h.

In addition, in the probe 200, no locking portion is formed on the side surface 220 opposing the locking portion 21, and the locking portion 21 of one of two adjacent probes 200 opposes the side surface 220 of the other, and the locking portions 21 of the both do not oppose each other. Therefore, it is possible to secure the same probe interval Li and to shorten the probe pitch Lp as compared with a case of using probes provided with the locking portions 21 on both the opposing side surfaces 210 and 220.

Although an example in which the side surface 220 opposing the locking portion 21 is flat has been described in the above embodiment, but the present invention is not limited only to such a case. That is, a side surface opposing the locking portion 21 only need to have the distance L32 from the central axis J that is shorter than the distance L31 from the central axis J to the protruding surface 212, and may have a recess or a protrusion, or may be a curved surface. That is, the central axis J may be eccentric toward the second direction d2 in a cross section including the locking portion 21.

Second Embodiment

In the first embodiment, the case of using the probe 200 that is arranged to be inclined with respect to the first guide plate 14, and has the locking portion 21 formed by causing the side surface 210 on the first direction d1 side on which the angle formed by the probe 200 and the first guide plate 14 above the first guide plate 14 is the acute angle A to protrude has been described. In the present embodiment, in addition to this, a case of using a probe 201 having an offset portion 22 in which a side surface 220 on a second direction d2 side opposite to a first direction d1 is offset toward a central axis J will be described.

Figure 9:
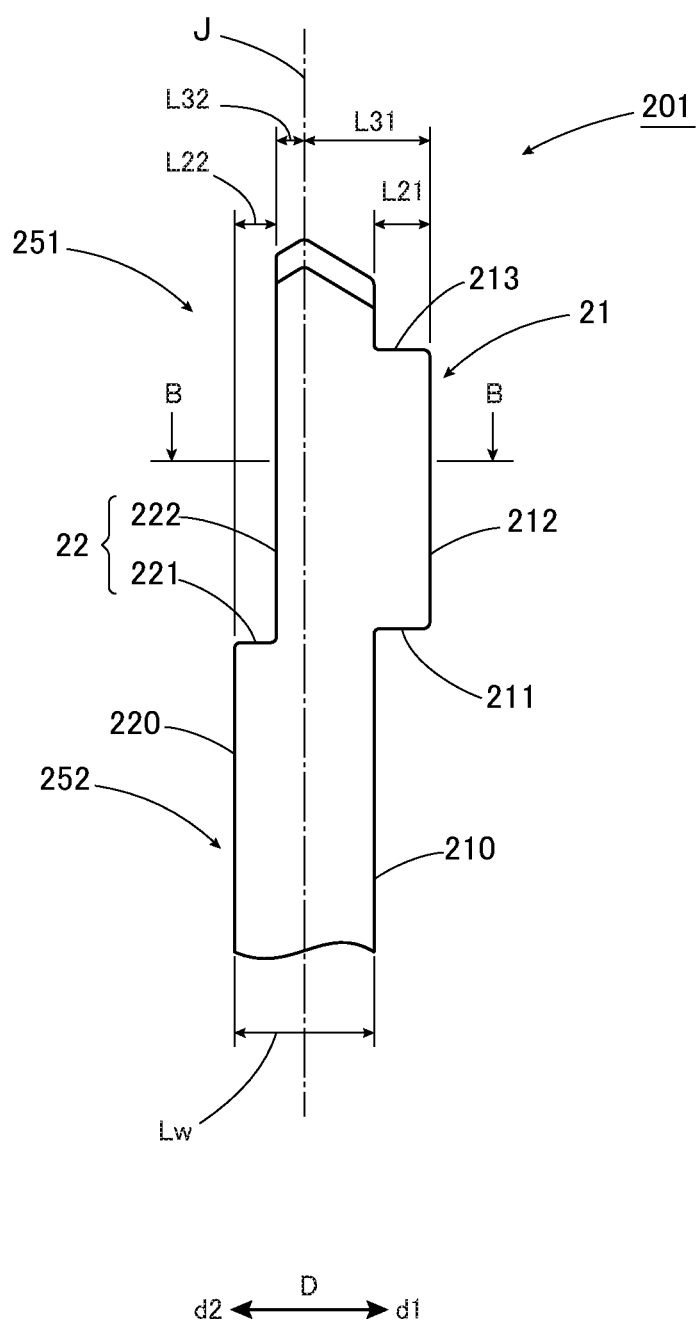
FIG. 9 is a partially enlarged view illustrating a part of the probe 201 in an enlarged manner.
Figure 10:
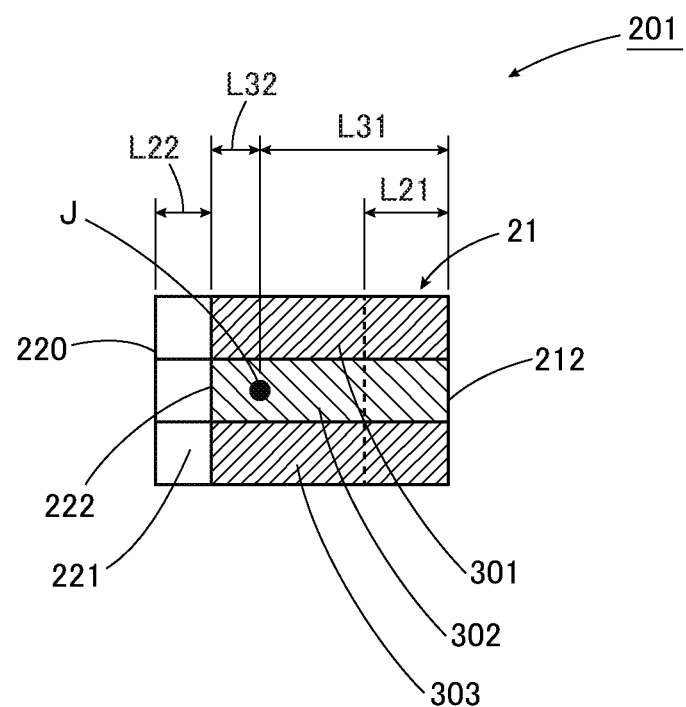
FIG. 10 is a cross-sectional view illustrating a cross section taken along line B-B in FIG. 9.

FIGS. 9 and 10 are views illustrating an example of a main part of the probe 201 forming a probe card according to a second embodiment of the present invention. FIG. 9 is a partially enlarged view illustrating a part of the probe 201 in an enlarged manner, and FIG. 10 is a cross-sectional view illustrating a cross section taken along line B-B in FIG. 9.

The probe 201 is different from the probe 200 (first embodiment) in FIG. 5 in terms of having the offset portion 22 in which the side surface 220 opposing a locking portion 21 is offset inward. The other configurations are similar to those of the probe 200, and thus, the redundant description thereof will be omitted.

The offset portion 22 is formed by offsetting the side surface 220 on the second direction d2 side of a probe upper portion 251 in a protruding direction of the locking portion 21, and has a lower surface 221 orthogonal to the central axis J and an offset surface 222 parallel to the central axis J. In addition, the offset portion 22 is provided at a position to correspond to the locking portion 21 on the central axis J, and the offset surface 222 opposes a protruding surface 212 and extends to an upper end of the probe. The lower surface 221 forms a stepped portion formed at a boundary between the side surface 220 and the offset surface 222, and is provided below a lower surface 211 of the locking portion 21. That is, a lower end of the offset portion 22 is located further below a lower end of the locking portion 21 on the central axis J.

In the drawing, L22 is an offset amount of the offset portion 22. A distance from the central axis J of the probe 201 is L31=Lw/2+L21 at the protruding surface 212 and is L32=Lw/2−L22 at the offset surface 222, and the distance of the offset surface 222 from the central axis J is shorter than that of the protruding surface 212 by the sum of a protrusion amount L21 and the offset amount L22.

Figure 11:
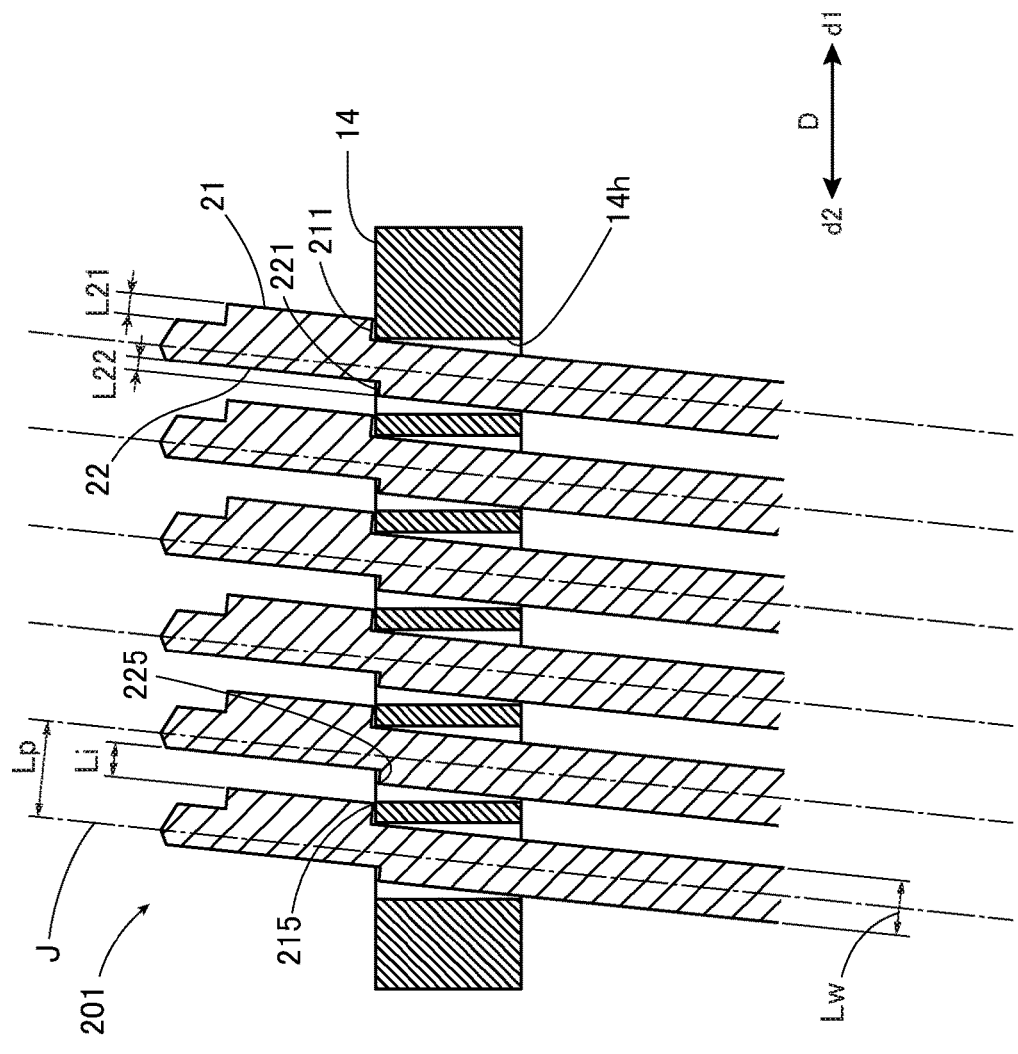
FIG. 11 is an enlarged cross-sectional view illustrating a part of a first guide plate 14 and the probe 201 in an enlarged manner.

FIG. 11 is an enlarged cross-sectional view illustrating a part of a first guide plate 14 and the probe 201 in an enlarged manner. The locking portion 21 of one of two adjacent probes 201 opposes the offset portion 22 of the other. In addition, the offset portion 22 is formed such that a lower end of the locking portion 21 of one of the two probes 201, arranged adjacent to each other, does not come into contact with the side surface 220 below the offset portion 22 of the other. Therefore, a probe pitch Lp set when the same probe interval Li is to be secured can be shortened by the offset amount L22 as compared with the probe 200 (the first embodiment) in FIG. 7.

In a state where the probe 201 is inclined, an outermost edge 225 of the lower surface 221 of the offset portion 22 is arranged below an outermost edge 215 of the lower surface 211 of the locking portion 21. That is, the outermost edge 225 of the lower surface 221 of the offset portion 22 is arranged below an upper surface of the first guide plate 14, for example, in a first guide hole 14h. When such a configuration is adopted, it is possible to prevent the outermost edge 215 of the lower surface 211 of the locking portion 21 from coming into contact with the side surface 220 below the offset portion 22. Note that the outermost edges 215 and 225 are edge portions of the lower surfaces 211 and 221 farthest from the central axis J.

The probe interval Li is a distance from the protruding surface 212 of one of adjacent probes 201 to the offset surface 222 of the other, and the probe pitch is Lp=Lw+L21−L22+Li. For example, when a probe width Lw is 20 μm, the protrusion amount L21 of the locking portion 21 is 71 μm, the offset amount L22 is 5 μm, and the probe interval Li is 13 μm, the probe pitch Lp is 35 μm.

Figure 12:
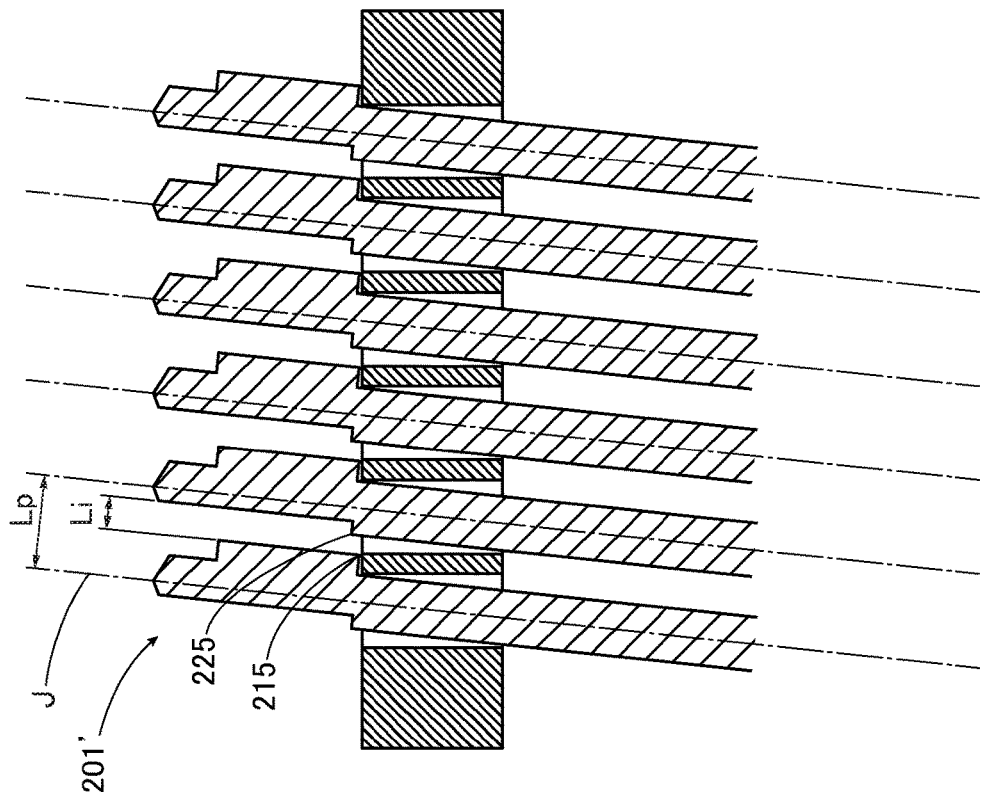
FIG. 12 is a view illustrating a main part of a comparative example to be compared with the second embodiment of the present invention.

FIG. 12 is a view illustrating a main part of a comparative example to be compared with the second embodiment of the present invention. In a probe 201' as the comparative example, a lower end of an offset portion 22 is provided at a position to correspond to a lower end of a locking portion 21. That is, a lower surface 221 of the offset portion 22 and a lower surface 211 of the locking portion 21 are formed at the same position on a central axis J of the probe 201'. Therefore, when the probe 201' is arranged to be inclined, an outermost edge 225 of the lower surface 221 of the offset portion 22 is located above an upper surface of a first guide plate 14, and an outermost edge 215 of the lower surface 211 of the locking portion 21 has the same height as a side surface 220 below the offset portion 22. As a result, there is a possibility that the locking portion 21 of one of two probes 201', arranged adjacent to each other, comes into contact with the side surface 220, which is not offset, of the other, and it is difficult to shorten a probe pitch Lp even if the offset portion 22 is provided.

The probe 201 forming the probe card according to the present embodiment includes the offset portion 22 in which the side surface 220 opposing the locking portion 21 is offset in the protruding direction of the locking portion 21. Therefore, the probe pitch Lp can be further shortened while securing the same probe interval Li as compared with a case where the offset portion 22 is not provided.

In addition, the lower end of the offset portion 22 is located below the upper surface of the first guide plate 14, for example, in the first guide hole 14h in the inclined state of the probe 201 forming the probe card according to the present embodiment. Therefore, between the two probes 201 arranged adjacent to each other, it is possible to prevent the locking portion 21 of one from coming into contact with the side surface 220 below the offset portion 22 of the other, and to shorten the probe pitch Lp.

Third Embodiment

In the second embodiment, the case of using the probe 201 having the offset portion 22 extending to the upper end of the probe has been described. On the other hand, a case of using a probe 202 having an offset portion 22 formed as a recess that does not reach an upper end of the probe will be described in the present embodiment.

Figure 13:
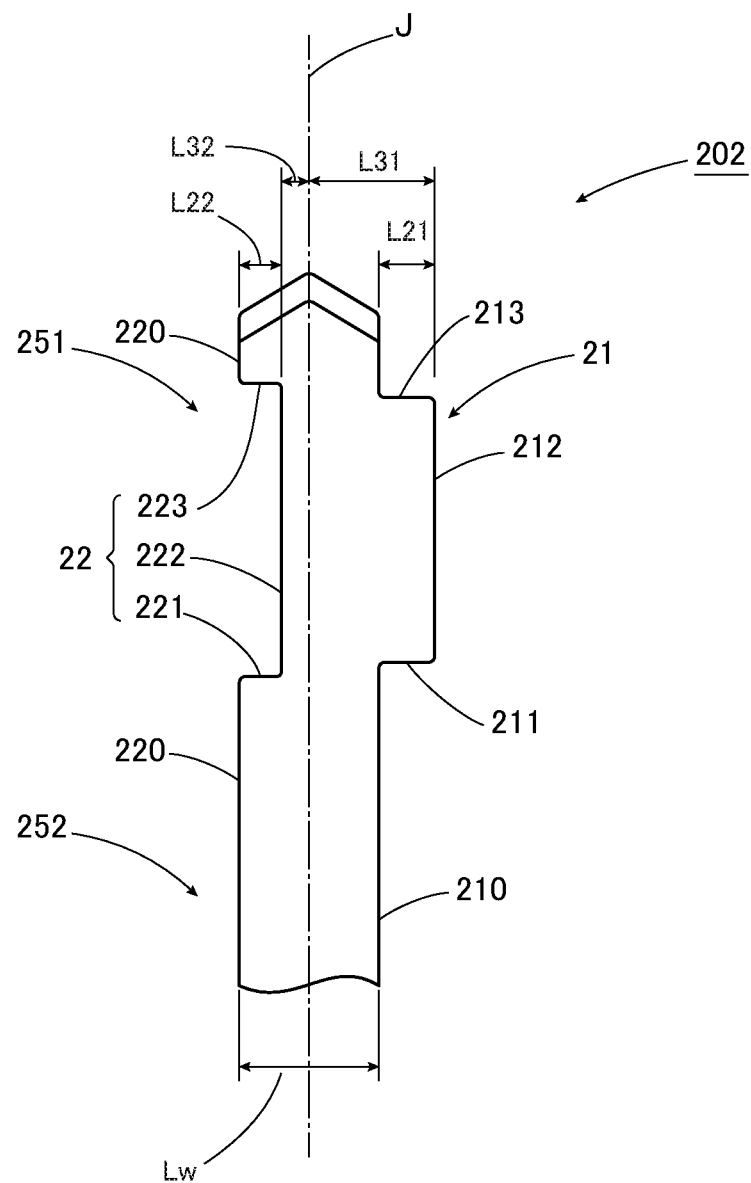
FIG. 13 is a view illustrating an example of a main part of the probe 202.

FIG. 13 is a view illustrating an example of a main part of the probe 202 forming a probe card according to a third embodiment of the present invention, and is a partially enlarged view illustrating a part of the probe 202 in an enlarged manner. The probe 202 is different from the probe 201 (the second embodiment) of FIG. 9 in that the offset portion 22 is formed as a recess that does not reach the upper end of the probe. The other configurations are similar to those of the probe 201, and thus, the redundant description thereof will be omitted.

The offset portion 22 is formed by offsetting a side surface 220 on a second direction d2 side of a probe upper portion 251 in a protruding direction of a locking portion 21, and has a lower surface 221 and an upper surface 223, which are orthogonal to a central axis J, and an offset surface 222 parallel to the central axis J. In addition, the offset portion 22 is provided at a position to correspond to the locking portion 21 on the central axis J, and the offset surface 222 opposes a protruding surface 212 of the locking portion 21.

The offset portion 22 is formed as the recess that does not reach the upper end of the probe, and the side surface 220 that is not offset is provided not only below but also above the offset portion 22. The upper surface 223 is a surface forming a stepped portion formed at a boundary between the offset surface 222 and the upper side surface 220. The upper surface 223 is provided above an upper surface 213 of the locking portion 21. That is, an upper end of the offset portion 22 is formed at a position further above an upper end of the locking portion 21 with respect to the central axis J. The lower surface 221 is a surface forming a stepped portion formed at a boundary between the offset surface 222 and the lower side surface 220. The lower surface 221 is provided below a lower surface 211 of the locking portion 21. That is, a lower end of the offset portion 22 is formed at a position further below a lower end of the locking portion 21 with respect to the central axis J.

Figure 14:
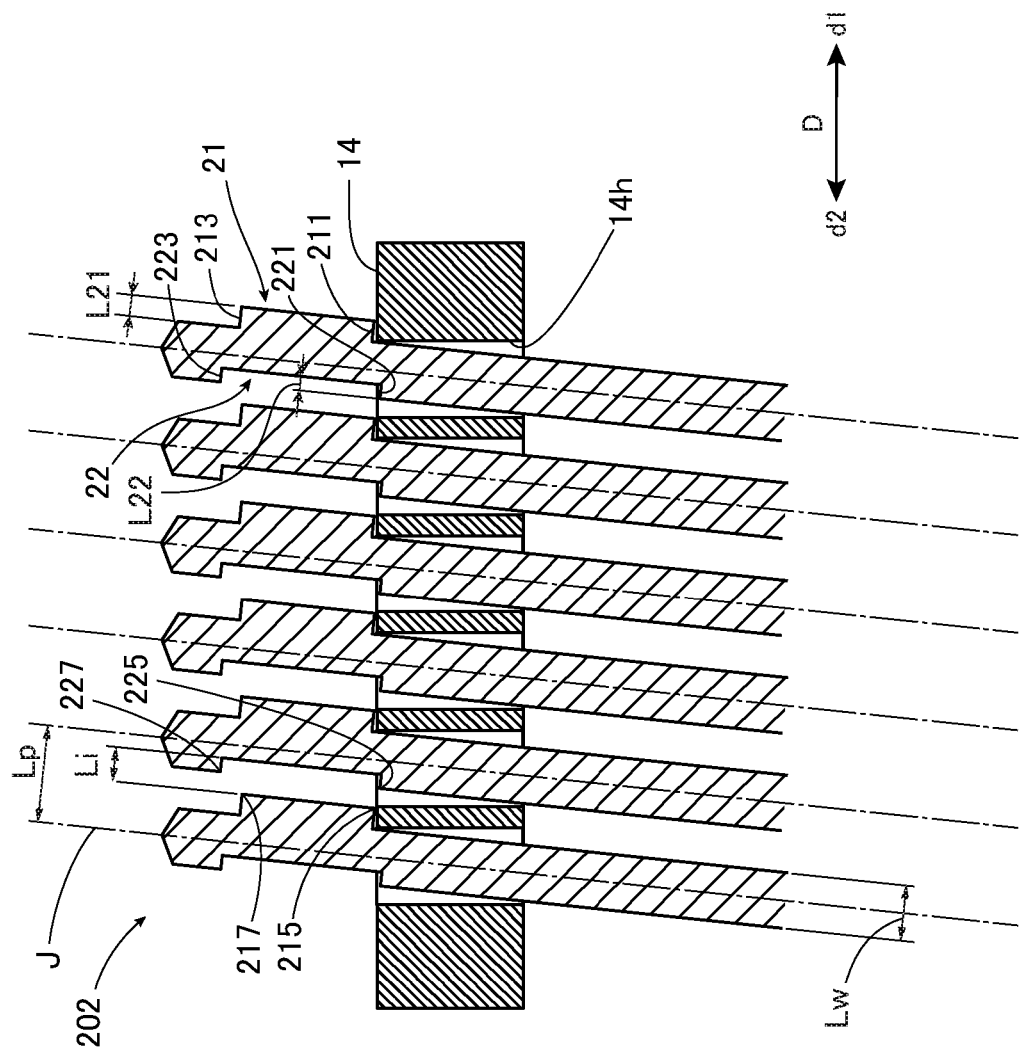
FIG. 14 is an enlarged cross-sectional view illustrating a part of a first guide plate 14 and the probe 202 in an enlarged manner.

FIG. 14 is an enlarged cross-sectional view illustrating a part of a first guide plate 14 and the probe 202 in an enlarged manner. The locking portion 21 of one of two adjacent probes 202 opposes the offset portion 22 of the other. In addition, the offset portion 22 is formed such that the lower end and the upper end of the locking portion 21 of one of the two probes 202 arranged adjacent to each other do not come into contact with any of the side surfaces 220 below or above the other offset portion 22. Therefore, a probe pitch Lp can be shortened as in the probe 201 of FIG. 11. In addition, a width of the upper end of the probe is not narrowed by offsetting since the offset portion 22 is formed as the recess, which is different from the probe 201 of FIG. 11. Therefore, a range of an inclination angle of the probe in which the upper end of the probe can be brought into contact with a probe electrode 11t can be expanded, and the probe 202 can be brought into contact with the probe electrode 11t for example, even when the inclination angle becomes excessively large.

In a state where the probe 202 is inclined, an outermost edge 225 of the lower surface 221 of the offset portion 22 is arranged below an outermost edge 215 of the lower surface 211 of the locking portion 21. That is, the outermost edge 225 of the lower surface 221 of the offset portion 22 is arranged below an upper surface of the first guide plate 14, for example, in a first guide hole 14h. When such a configuration is adopted, it is possible to prevent the outermost edge 215 of the lower surface 211 of the locking portion 21 from coming into contact with the side surface 220 below the offset portion 22.

In addition, in the state where the probe 202 is inclined, an outermost edge 227 of the upper surface 223 of the offset portion 22 is arranged above an outermost edge 217 of the upper surface 213 of the locking portion 21. Since such a configuration is adopted, it is possible to prevent the outermost edge 217 of the upper surface 213 of the locking portion 21 from coming into contact with the side surface 220 above the offset portion 22. The outermost edges 217 and 227 are edges of the upper surfaces 213 and 223 farthest from the central axis J.

Fourth Embodiment

In the third embodiment, the case of using the probe 202 in which the upper surface 213 of the locking portion 21 and the lower surface 221 and the upper surface 223 of the offset portion 22 are orthogonal to the central axis J has been described. On the other hand, a case of using a probe 203 in which these are inclined with respect to a central axis J will be described in the present embodiment.

Figure 15:
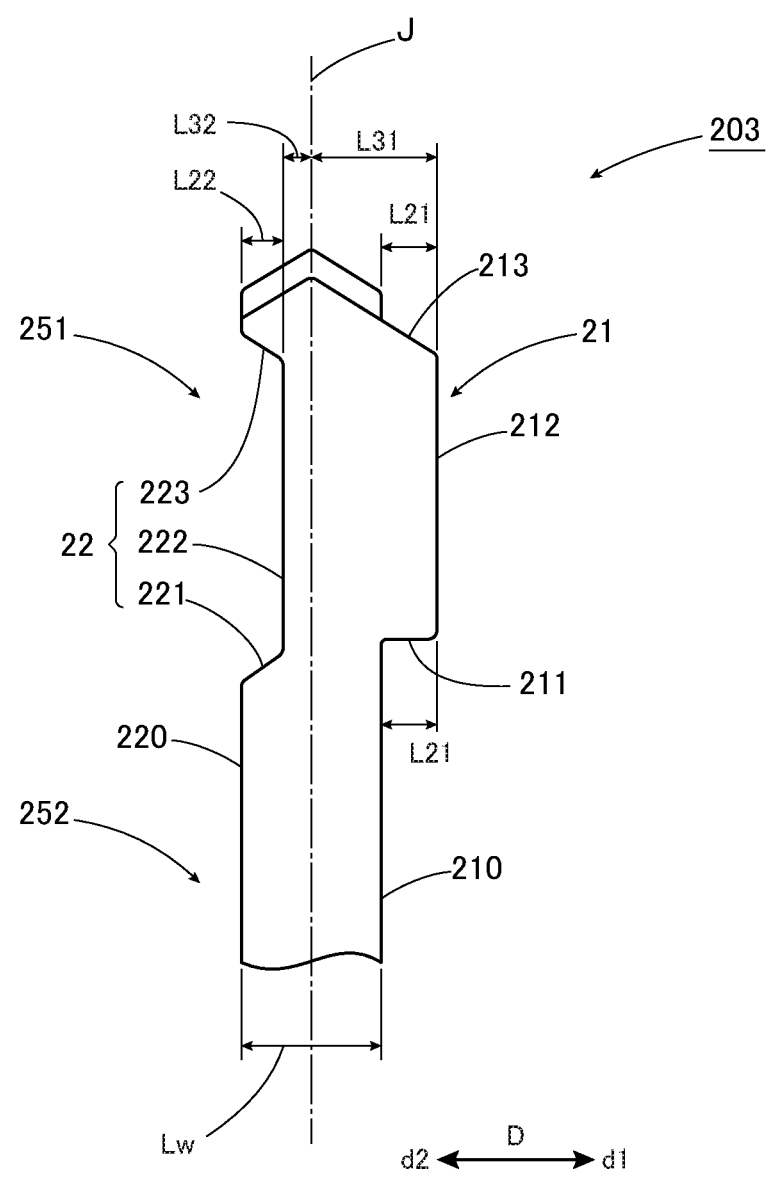
FIG. 15 is a view illustrating an example of a main part of the probe 203.

FIG. 15 is a view illustrating an example of a main part of the probe 203 forming a probe card according to a fourth embodiment of the present invention, and is a partially enlarged view illustrating a part of the probe 203 in an enlarged manner. The probe 203 is different from the probe 202 (the third embodiment) of FIG. 13 in that an upper surface 213 of a locking portion 21 and a lower surface 221 and an upper surface 223 of an offset portion 22 are inclined with respect to the central axis J. The other configurations are similar to those of the probe 202, and thus, the redundant description thereof will be omitted.

The locking portion 21 is formed by causing a side surface 210 on a first direction side of a probe upper portion 251 to protrude, and has a lower surface 211 orthogonal to the central axis J, a protruding surface 212 parallel to the central axis J, and the upper surface 213 inclined with respect to the central axis J. The upper surface 213 is a flat surface or a curved surface inclined so as to approach the central axis J with a protrusion amount decreasing toward the upper side.

The offset portion 22 is formed by offsetting a side surface 220 on a second direction side of the probe upper portion 251 in a protruding direction of the locking portion 21, and includes the lower surface 221 and the upper surface 223 inclined with respect to the central axis J, and an offset surface 222 parallel to the central axis J. The offset portion 22 is provided at a position to correspond to the locking portion 21 on the central axis J, and the offset surface 222 opposes the protruding surface 212 of the locking portion 21. The lower surface 221 formed below the offset surface 222 is a flat surface or a curved surface that is provided below the lower surface 211 of the locking portion 21, has an offset amount decreasing toward the lower side, and is inclined so as to be away from the central axis J. The upper surface 223 formed above the offset surface 222 is a flat surface or a curved surface that has an offset amount decreasing toward the lower side and is inclined so as to be away from the central axis J.

Figure 16:
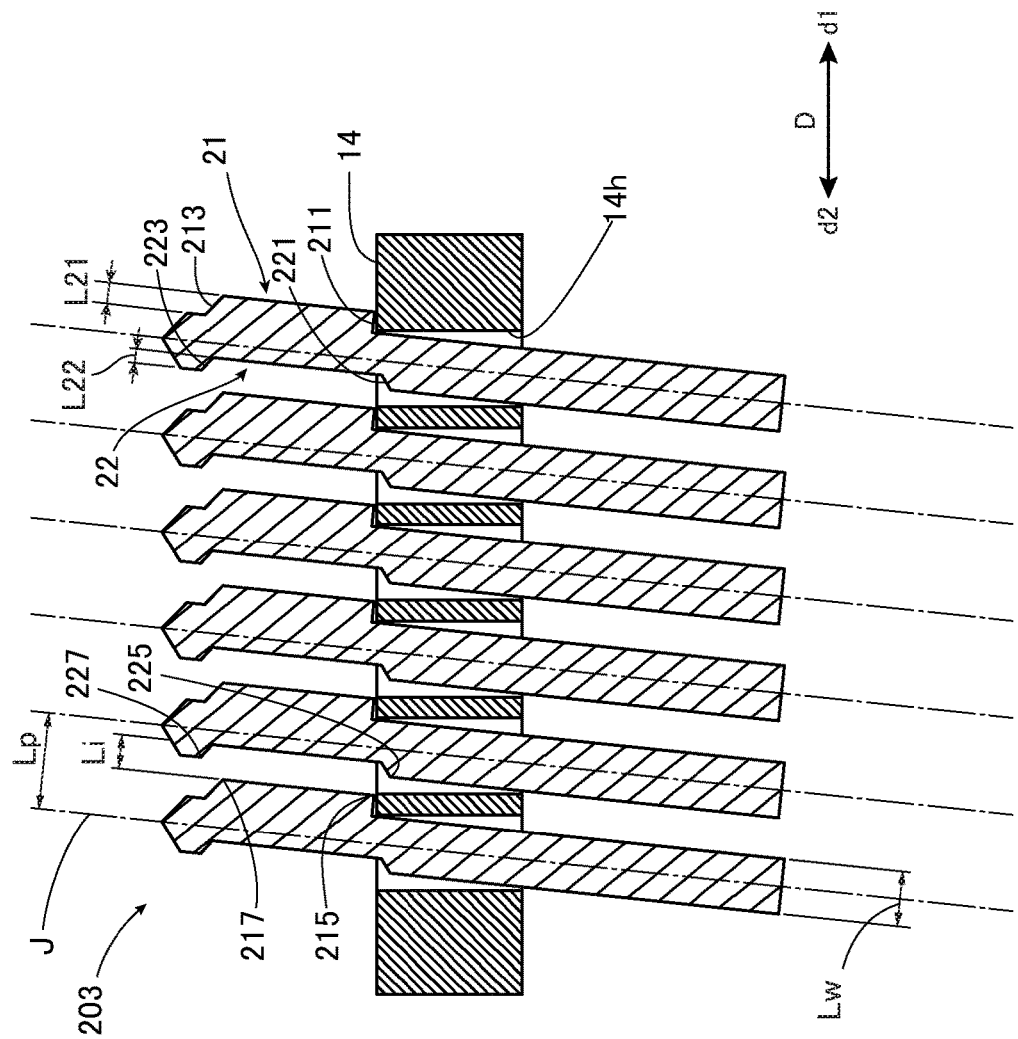
FIG. 16 is an enlarged cross-sectional view illustrating a part of the first guide plate 14 and the probe 203 in an enlarged manner.
Figure 17:
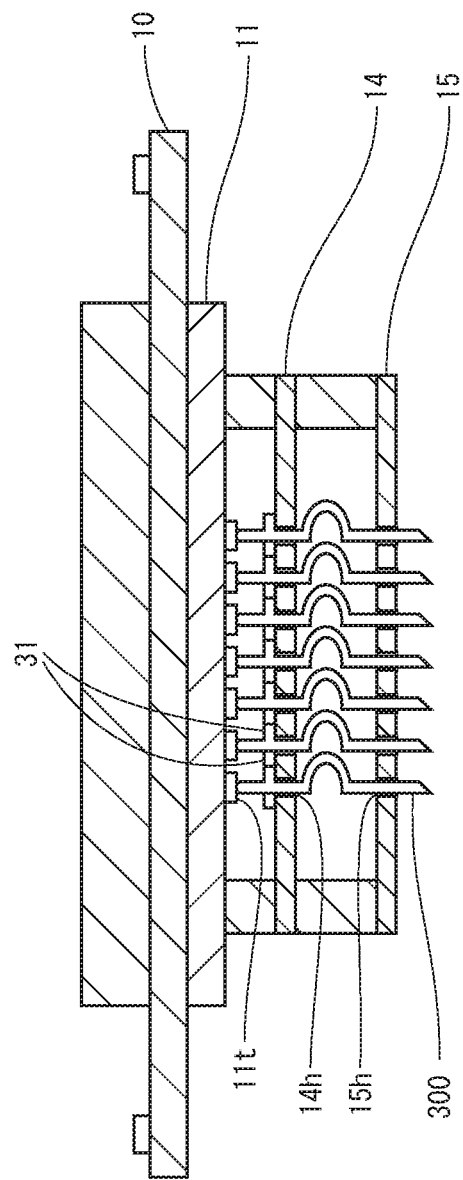
FIG. 17 is a diagram illustrating an example of a conventional probe card.

FIG. 16 is an enlarged cross-sectional view illustrating a part of the first guide plate 14 and the probe 203 in an enlarged manner. Since the locking portion 21 of one of two adjacent probes 203 opposes the offset portion 22 of the other, a probe pitch Lp can be shortened as in the probe 202 (the third embodiment) of FIG. 14. On the other hand, it is possible to suppress contact of one locking portion 21 with the other between the two probes 203 arranged adjacent to each other since the upper surface 213 of the locking portion 21, the lower surface 221 of the offset portion 22, and the upper surface 223 of the offset portion 22 are inclined with respect to the central axis J, which is different from the probe 201 of FIG. 11. In addition, it is possible to suppress an influence on electrical characteristics and mechanical strength of the probe 203 by providing the offset portion 22.

In addition, in a state where the probe 202 is inclined, an outermost edge 225 of the lower surface 221 of the offset portion 22 is arranged below an outermost edge 215 of the lower surface 211 of the locking portion 21, and an outermost edge 227 of the upper surface 223 of the offset portion 22 is arranged above an outermost edge 217 of the upper surface 213 of the locking portion 21. Since such a configuration is adopted, it is possible to prevent the locking portion 21 from coming into contact with the side surface 220 in the vicinity of the offset portion 22.

Note that it is possible to suppress an upper end or a lower end of one locking portion 21 from coming into contact with the other between two probes 201 arranged adjacent to each other by inclining the upper surface 213 of the locking portion 21 or the lower surface 221 of the offset portion 22 with respect to the central axis J similarly for the probe 201 (Embodiment 2) illustrated in FIG. 9.

DESCRIPTION OF REFERENCE NUMERALS 100 probe card
10 main board (wiring board)
10t external electrode
11 ST board (wiring board)
11t probe electrode
12 reinforcing plate
13 spacer
14 first guide plate
14h first guide hole
15 second guide plate
15h second guide hole
200 to 203 probes
21 locking portion
210 surface on the first direction side
211 lower surface of the locking portion
212 protruding surface of the locking portion
213 upper surface of the locking portion
215 outermost edge of the lower surface of the locking portion
217 outermost edge of the upper surface of the locking portion
22 offset portion
220 side surface on the second direction
221 lower surface of the offset portion
222 offset surface of the offset portion
223 upper surface of the offset portion
225 outermost edge of the lower surface of the offset portion
227 outermost edge of the upper surface of the offset portion
251 probe upper portion
252 probe body
253 probe lower portion
301 to 303 main layers
304 contact layer
D inclination direction
d1 first direction
d2 second direction
Hi interval between the first guide holes
Hp pitch between the first guide holes
Hw width of first guide hole
J central axis
L21 protrusion amount
L22 offset amount
L31 distance from the central axis to the protruding surface
L32 distance from the central axis to the offset surface
Li probe interval
Lp probe pitch
Lw probe width

The invention claimed is:

1. A probe card comprising:
two or more probes; and
a first guide plate having two or more first guide holes through which the probes are inserted, respectively,
wherein the probe is arranged to be inclined with respect to the first guide plate and has:
a locking portion that protrudes from a first sidewall of the probe above the first guide plate and is locked to the first guide plate, the first sidewall being at an acute angle with respect to the first guide plate, and
a recess formed by offsetting a second sidewall opposite to the first sidewall toward the locking portion, the second sidewall being at an obtuse angle with respect to the first guide plate,
the locking portion of one of the probes opposes the recess of another of the probes adjacent to the one,
a lower surface of the recess is formed below a lower surface of the locking portion on the central axis of the probe, and
an outermost edge of an upper surface of the recess is formed above an outermost edge of an upper surface of the locking portion on the central axis of the probe.

2. The probe card according to claim 1, further comprising a second guide plate which is arranged below the first guide plate and has two or more second guide holes through which the probes are inserted, respectively,
wherein the first guide hole and the second guide hole are arranged at positions relatively offset in a direction in which the probe is inclined,
the probe is curvedly deformed between the first guide plate and the second guide plate, and
the locking portion of the probe is inclined with respect to the first guide plate and the second guide plate in a direction of buckling and deforming during overdrive.

3. The probe card according to claim 1, wherein
the probe has a multi-layer structure in which multiple layers overlap in a thickness direction, and
a contact layer contacting each of end surfaces of the multiple layers is formed on an upper end surface of the probe.

* * * * *